United States Patent [19]

Oodaira et al.

[11] Patent Number: 4,751,126
[45] Date of Patent: Jun. 14, 1988

[54] A METHOD OF MAKING A CIRCUIT BOARD AND A CIRCUIT BOARD PRODUCED THEREBY

[75] Inventors: Hirosi Oodaira, Chigasaki; Yoshikatsu Fukumoto, Hamura; Shuji Hiranuma, Kawasaki; Masayuki Ohuchi, Koganei; Tamio Saito, Oome, all of Japan

[73] Assignee: Kabushiki Kaisha Toshiba, Kawasaki, Japan

[21] Appl. No.: 881,569

[22] Filed: Jul. 2, 1986

Related U.S. Application Data

[62] Division of Ser. No. 668,320, Nov. 5, 1984, abandoned.

[30] Foreign Application Priority Data

Dec. 19, 1983 [JP] Japan .................... 58-237804

[51] Int. Cl.[4] .................... B05D 5/10; B32B 31/00
[52] U.S. Cl. ........................ 428/139; 29/830; 29/832; 29/853; 156/182; 156/252; 156/277; 156/293; 156/298; 156/307.3; 156/309.6; 174/68.5; 428/140; 428/901
[58] Field of Search ............ 428/901, 139, 140; 29/830, 853, 832; 156/252, 298, 277, 293, 309.6, 307.3, 182; 174/68.5

[56] References Cited

U.S. PATENT DOCUMENTS

| | | | |
|---|---|---|---|
| 2,683,839 | 7/1954 | Beck | 174/68.5 |
| 2,958,120 | 11/1960 | Taylor | 156/298 |
| 3,010,863 | 11/1961 | Coe et al. | 156/298 |
| 3,135,823 | 6/1964 | Pritikin | 174/68.5 |
| 3,431,350 | 3/1969 | Haberrecht | 174/68.5 |
| 3,501,832 | 3/1970 | Iwata et al. | 361/398 X |
| 3,670,205 | 6/1972 | Dixon et al. | 361/411 X |
| 3,680,209 | 8/1972 | Hacke | 361/414 X |
| 4,377,652 | 3/1983 | Ohmura et al. | 524/104 |
| 4,394,710 | 7/1983 | Brower et al. | 361/401 |
| 4,517,050 | 5/1985 | Johnson et al. | 174/68.5 X |

Primary Examiner—John J. Gallagher
Attorney, Agent, or Firm—Oblon, Fisher, Spivak, McClelland & Maier

[57] ABSTRACT

A circuit board is prepared such that at least two resin substrates are laminated and bonded by thermocompression, a circuit pattern made of a resin composition containing a conductor material is formed on at least one of opposing surfaces of the substrates, a region of the substrate which corresponds to a specific portion of the circuit pattern is recessed, the specific portion of the circuit projects into the recess in accordance with plastic deformation of the substrates and the circuit pattern which is caused by thermocompression bonding, and the specific portion of the circuit pattern constitutes an exposed portion. Multilayer or three-dimensional wiring can be easily achieved in the circuit board.

10 Claims, 6 Drawing Sheets

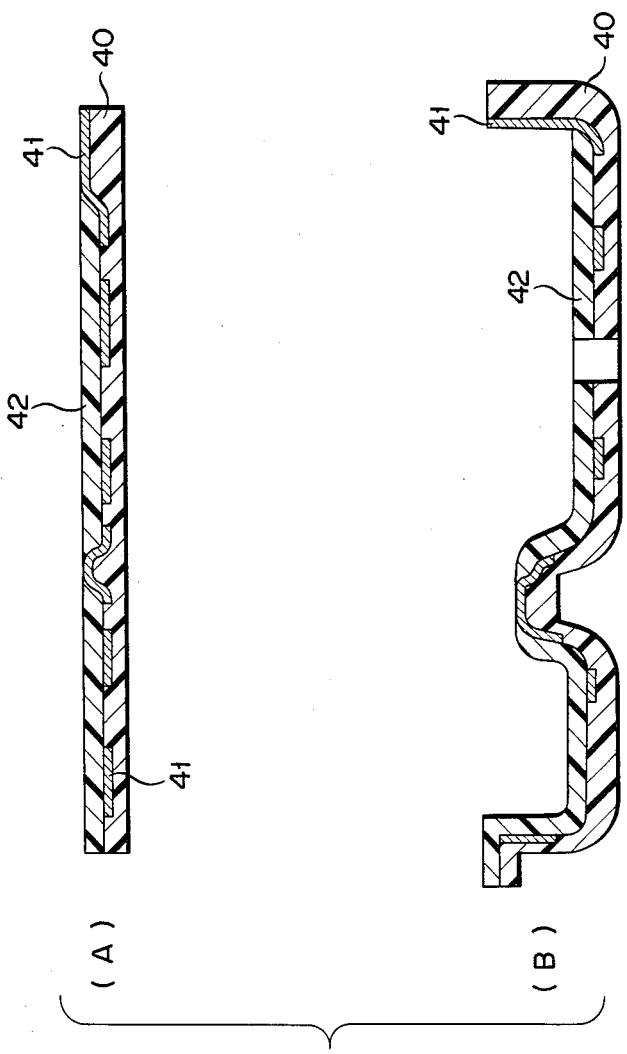

A METHOD OF MAKING A CIRCUIT BOARD AND A CIRCUIT BOARD PRODUCED THEREBY

This is a division of application Ser. No. 668,320, filed Nov. 5, 1984, now abandoned.

BACKGROUND OF THE INVENTION

The present invention relates to a circuit board and, more particularly, to a circuit board prepared using a resin as a base material.

Thermosetting resins are conventionally used as base materials to prepare cirucuit boards such as paper-phenol circuit boards, glass mat-polyester circuit boards and glass-epoxy circuit boards. In these circuit boards, a copper-clad thermosetting laminate is used, a resist pattern is printed, and unnecessary copper portions are selectively dissolved and removed by etching, thereby preparing a circuit pattern.

In order to obtain a circuit of high packing density, a multi-layer circuit pattern is produced. In this case, in order to connect circuit patterns between every two adjacent layers, nonelectrolytic plating techniques are frequently used. Etched copper-clad circuit boards are alternatively bonded by thermocompression with prepregs. Holes are formed in the multi-layer laminate and the wall surfaces of these holes are then subjected to nonelectrolytic plating. The upper and lower surfaces of the multi-layer laminate are then etched to obtain predetermined patterns. In this manner, the interlayer circuit patterns are electrically connected. According to this conventional technique, the process is complicated, and the circuit board is of high cost.

Another conventional multi-layer circuit board is a thick film circuit board obtained such that a conductor paste is printed and sintered on an insulating substrate, and an insulating paste is printed and sintered on the conductor pattern. The above process is repeated to prepare this multi-layer circuit board. According to this process, the through hole process, i.e., coating of the conductor on the wall surfaces of the holes, need not be performed, thus resulting in a simple process. However, when printing is repeated to increase the thickness of a resultant laminate, steps are accumulated. In practice, printing cannot be performed for a laminate having four or more layers.

In all the conventional multi-layer circuit boards, the insulating substrate surface does not have the same level as that of the circuit pattern surface. The circuit pattern surface often extends above the insulating substrate by several tens of microns. Therefore, in a electric component subjected to sliding along the circuit board (e.g., coupling operation of a connector, or sliding of contacts of a switch and a variable resistor), the operation becomes unstable, and mechanical wear and electric are occur.

SUMMARY OF THE INVENTION

It is an object of the present invention to provide a circuit board wherein a circuit pattern does not project above the surface of an insulating substrate, thereby easily forming a multilayer structure or three-dimensional wiring.

According to a circuit board of the present invention, at least two insulating resin substrates are laminated and are bonded by thermocompression to obtain a laminate, and a circuit pattern made of a resin composition containing a conductive material is formed on at least one of opposing surfaces of the substrates. A region of the substrate which corresponds to a specific portion of the circuit pattern is recessed. The specific portion of the circuit pattern is projected inside the recess by plastic deformation of the substrate and the circuit pattern in accordance with thermocompression bonding. When the recess comprises a through hole, the specific portion of the circuit pattern is exposed so that the surface of the circuit pattern can have the same level as that of the substrate. A circuit element such as a resistor, a capacitor or a diode connected to the circuit pattern may be buried between the substrates by utilizing plastic deformation of the substrates and the corresponding circuit patterns.

According to the present invention, a pair of substrates having circuit patterns on opposing surfaces thereof are prepared. Another intermediate substrate is also prepared. A through hole is formed in the intermediate substrate at a position corresponding to the specific portion of the circuit pattern. Thereafter, when the three substrates are bonded by thermocompression, the specific portions of the two circuit patterns are inserted into the through holes by plastic deformation and are bonded to each other.

When a thermoplastic resin is used as a resin constituting the substrate, a resin in a resin composition for the circuit pattern preferably comprises the same thermoplastic resin. Similarly, when a thermosetting resin is used as a resin constituting the substrate, a resin in a resin composition for the circuit pattern preferably comprises the same thermosetting resin. When thermocompression bonding is performed, the resin is subjected to a crosslinking reaction and cured by heat, a catalyst or radiation. The circuit board of the present invention is preferably used in an electronic calculator, an IC card or the like.

BRIEF DESCRIPTION OF THE DRAWINGS

FIGS. 4A and 4B are respectively sectional views for explaining steps in manufacturing a circuit board according to still another embodiment of the present invention;

DETAILED DESCRIPTION OF THE PREFERRED EMBODIMENTS

Figure 1:
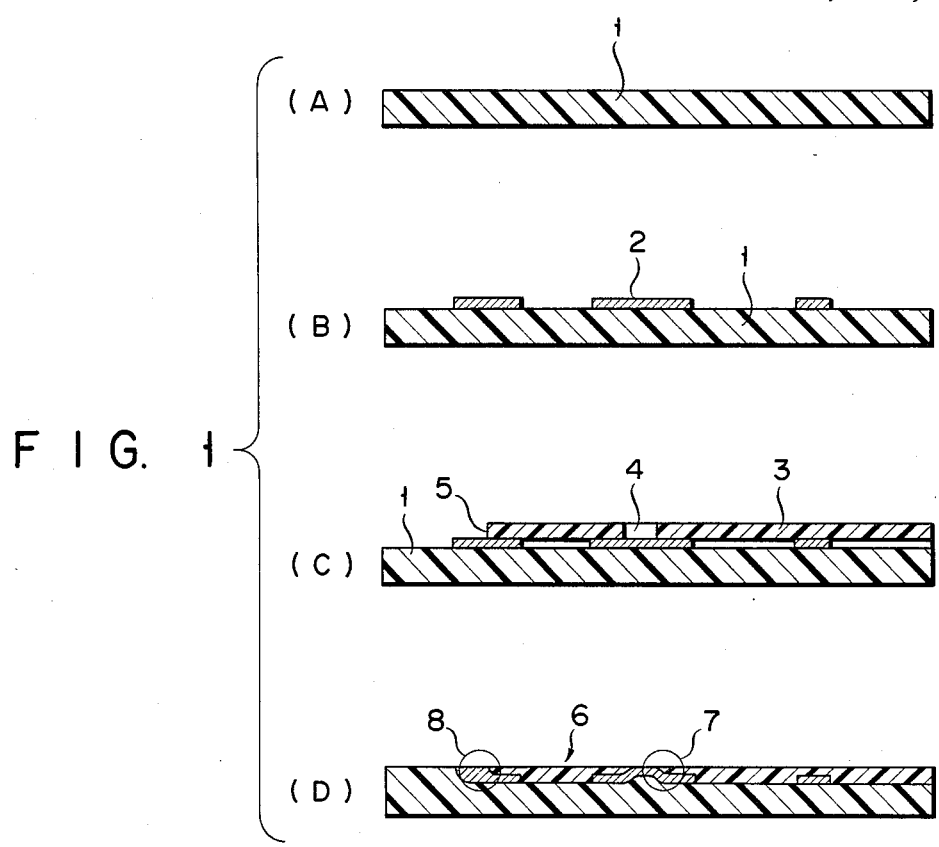
FIGS. 1A to 1D are respectively sectional views for explaining steps in manufacturing a circuit board according to an embodiment of the present invention.

A circuit board according to an aspect of the present invention will be described with reference to FIGS. 1A to 1D in accordance with the sequential order of steps.

As shown in FIG. 1(A), reference numeral 1 denotes a substrate made of a synthetic resin. A circuit pattern 2 is formed on one major surface of the substrate by a method to be described in detail later. The circuit pattern 2 comprises a conductive resin composition consisting of a synthetic resin binder and a conductive material (e.g., metal powder). When a thermoplastic resin is used as a resin constituting the substrate, the substrate must have electrical insulation properties and resistance to humidity and heat. For example, the substrate may comprise polycarbonate resin, polystyrene resin, polyacetal resin, polyphenylene sulfide resin, acrylic resin, polyolefin resin, ABS resin, nylon, polyphenylene oxide resin, polyvinyl chloride resin or fluoroplastic. The substrate may comprise a thermosetting resin such as epoxy resin, polyester resin, 1,2-polybutadiene resin, acrylic resin, polyurethane resin, novolak phenol resin, polyimide resin, polystyrene resin or polyethylene resin. The thermosetting resin is subjected to a crosslinking reaction and cured by means of heat, a catalyst or radiation.

A conductive material used in a conductive resin composition may comprise a metal powder of gold, silver, copper, nickel, tungsten, molybdenum, platinum, aluminum, tin or an alloy thereof, or a powder mixture thereof. In addition, carbon powder, silicon carbide powder, vanadium pentoxide powder, ruthenium oxide powder may also be used. The resin used for the substrate is preferably, but need not be, the same as that for the circuit pattern. A combination of different resins may be used. Printing is the preferred method of forming a conductive composition layer into a desired circuit pattern. In particular, a conductive composition may be dissolved in a solvent to prepare a conductive paste, and patterning is performed by printing (e.g., screen printing, offset printing, an inkjet method). The circuit pattern may be patterned by electrostatically printing a conductive powder. Alternatively, a heat-sensitive property may be attributed to the conductive composition, and the composition may be selectively heated to obtain a circuit pattern.

Figure 2:
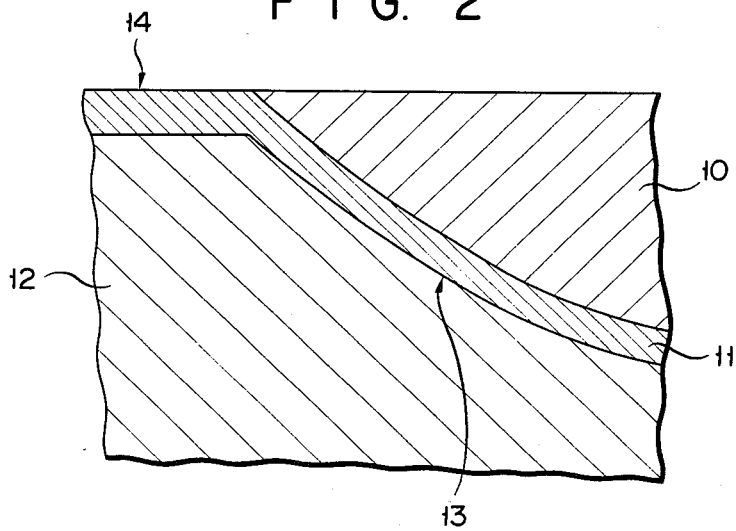
FIG. 2 is an enlarged view of the circuit board shown in FIG. 1D.

The upper surface of the circuit pattern 2 is covered with another resin substrate 3, as shown in FIG. 1(C). This substrate 3 is preferably, but need not be, made of the same type of resin as in the substrate 1. When adhesion between the substrates 1 and 3 is poor, an adhesive layer is formed on at least one of the surfaces of the substrates 1 and 3. The substrate 3 for covering the circuit pattern 2 may be simply placed on the substrate 1 or may be fixed thereon by means of printing, pressing or lamination. In this case, a hole 4 or a cut-away portion 5 is formed in a region of the substrate 3 which corresponds to a special portion of the circuit pattern 2. In this state, when the substrates 1 and 3 are bonded by thermocompression at a predetermined temperature and pressure, the substrates 1 and 3 and the corresponding circuit pattern 2 are subjected to plastic deformation. As shown in FIG. 1(D), a circuit board 6 having a smooth surface is obtained. FIG. 2 is an enlarged sectional view showing two regions 7 and 8 of the circuit board 6. Referring to FIG. 2, a region 10 corresponds to the substrate 3 in FIG. 1, a region 11 corresponds to the circuit pattern 2, and a region 12 corresponds to the substrate 1 in FIG. 1. As is apparent from FIG. 2, the region 11 comprises a smooth curved portion 13 and an exposed straight portion 14 continuous to the curved portion 13. As shown in FIGS. 1(D) and 2, when the substrate 1, the circuit pattern 2 and the substrate 3 are integrally formed by thermocompression bonding, at boundaries between the circuit pattern 2 and the substrates 1 and 3, the circuit pattern 2 will not be disconnected. Part of the circuit pattern 2 projects into the through hole 4 or the cut away portion 5 and has the same level as that of the substrate 3, thereby guaranteeing electrical connection.

The following technique may be employed to improve a wear resistance of the exposed portion of the circuit pattern 2 shown in FIG. 1D and hence increase connecting strength with another terminal. For example, a copper-or nickel-plated layer is formed on the exposed surface, and a gold- or silver-plated layer is formed on the copper- or nickel-plated layer. The projected plated layer is inserted in the recess of the substrate 3 with heat and pressure so as to cause the exposed pattern surface to have the same level as that of the substrate 3. Another technique may also be employed in which a thin gold or silver piece is inserted in the through hole 4 and is then bonded by thermocompression to cause the exposed circuit pattern surface to have the same level as that of the substrate 3.

Another aspect of the present invention will be described with reference to FIGS. 3A and 3B.

Figure 3:
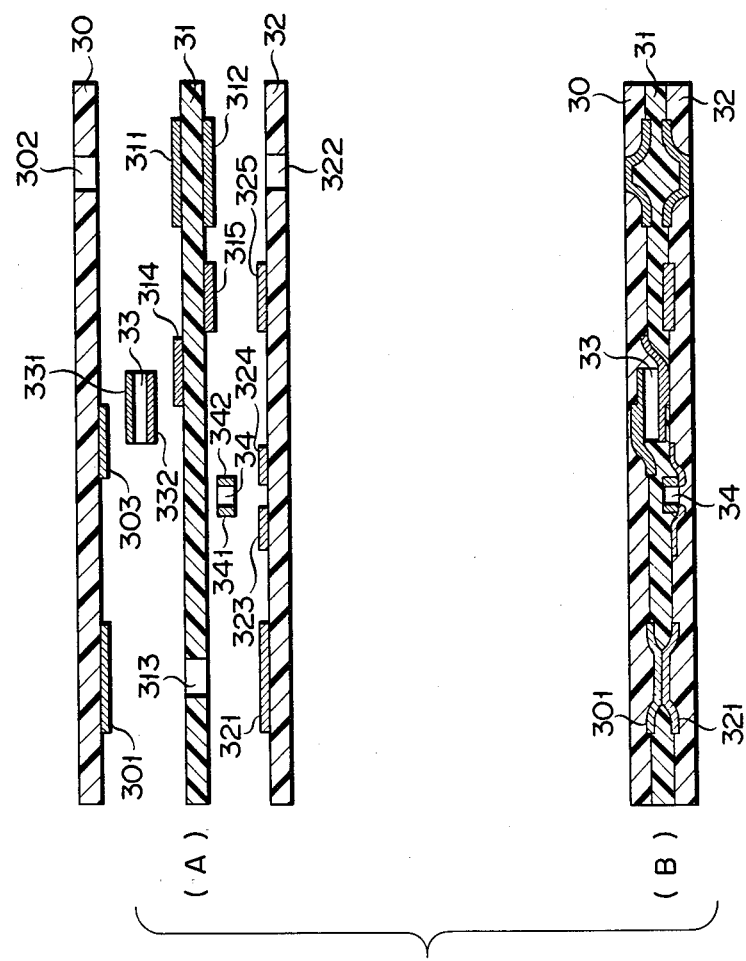
FIGS. 3A and 3B are respectively sectional views for explaining steps in manufacturing a circuit board according to another embodiment of the present invention.

As shown in FIG. 3(A), three substrates 30, 31 and 32 made of a resin are prepared. Circuit patterns 301 and 303 are formed on the lower surface of the upper substrate 30. A through hole 302 is formed at the right end portion of the upper substrate 30. Circuit patterns 311 and 314 and circuit patterns 312 and 315 are respectively formed on the upper and lower surfaces of the intermediate substrate 31. A through hole 313 is formed at the left end portion of the intermediate substrate 31. Circuit patterns 321, 323, 324 and 325 are formed on the upper surface of the lower substrate 32, and a through hole 322 is formed at the right end portion thereof. A resistor 33 is inserted at a specific position between the upper substrate 30 and the intermediate substrate 31, and a diode 34 is inserted at another specific position between the intermediate substrate 31 and the lower substrate 32. In this state, when the three substrates 30, 31 and 32 are bonded by thermocompression, a circuit board as shown in FIG. 3(B) is obtained. The circuit patterns 311 and 312 on the intermediate substrate 31 project into the through hole 302 of the upper layer 30 and the through hole 322 of the lower layer 32 and have the same level as those of the upper and lower surfaces of the substrates 30 and 32, respectively. The circuit patterns 301 and 321 project into the through hole 313 formed in the intermediate substrate 31 and are brought into contact with each other and connected to each other in the through hole 313. The resistor 33 has upper and lower electrodes 331 and 332. The upper electrode 331 of the resistor 33 is connected to the circuit pattern 303 on the upper substrate 30, and the lower electrode 332 of the resistor 33 is connected to the circuit pattern 314 of the intermediate substrate 31. In this case, the resistor 33 is buried between the substrates 30 and 31. The diode 34 has left and right electrodes 341 and 342. The left electrode 341 is connected to the circuit pattern 323 of the lower substrate 32, and the right electrode 342 is connected to the circuit pattern 324. In this case, the diode 34 is buried between the substrates 31 and 32. The position of the circuit pattern 31S of the intermediate substrate 31 corresponds to that of the circuit pattern 32S of the lower substrate 32 and is formed integrally therewith. When the three substrates 30 to 32 are bonded integrally, the thickness of the resultant three-layer circuit board is substantially equal to or less than the total thickness of the three substrates 30 to 32. The circuit board according to the present invention is not limited to the three-layer structure, but may be applied to any multilayer structure to obtain the same effect as in the above embodiment.

When thermocompression bonding cannot be performed due to the increased number of wiring layers, two adjacent upper or lower layers are aligned, and thermocompression bonding is performed in units of layers.

According to the present invention, the circuit pattern can be deformed in accordance with plastic deformation without disconnection at the time of thermocompression bonding, and a three-dimensional circuit board structure can be easily obtained. A circuit board 40 shown in FIG. 4(A) is prepared in accordance with the method described with reference to FIGS. 1(A) to 1(D). Referring to FIG. 4(A), reference numerals 40 and 42 denote resin substrates; and 41, circuit patterns. The substrate 40 is heated and set in a state subjected to plastic deformation. This structure can be formed into a three-dimensional structure in accordance with vacuum molding or cold rolling, as shown in FIG. 4(B). This three-dimensional structure can be used as a housing for electronic equipment when the inner surface thereof is used as an insulating layer and the other surface thereof is used as a circuit layer, thus providing a great industrial advantage.

The present invention will now be described by way of examples.

EXAMPLE 1

The manufacturing process will be described with reference to FIGS. 1(A) to 1(D).

A rigid vinyl chloride substrate 1 having a thickness of 0.3 mm was prepared. 300 parts by weight of a solvent mixture of cyclohexanone/n-butyl carbitol=1/1 were added to 100 parts by weight of a vinyl chloride resin having an average molecular weight of 800. The resultant mixture was heated to obtain a homogeneous solution. 850 parts by weight of silver powder having an average particle size of 5$\mu$ were added to this solution. The resultant mixture was then kneaded by a paint roll to prepare a conductive resin composition. This composition was printed by screen printing on a surface of the substrate 1, as shown in FIG. 1(B). The composition was dried at 40° C. for 30 minutes under a reduced pressure, thereby forming a circuit pattern 2. A through hole 4 having a diameter of 3 mm was formed at a predetermined position of a 0.1-mm thick insulating film 3 made of hard vinyl chloride resin. The insulating film 3 was covered on the circuit pattern 2 of the substrate 1 and was bonded thereto by thermocompression, as shown in FIG. 1(C). Thermocompression bonding was performed at a pressure of 20 kg/cm$^2$ (resin pressure) at a temperature of 150° C. for 30 minutes. The resultant circuit board is shown in FIG. 1(D). The surface of the insulating film had the same level as those of the exposed conductor portions 7 and 8. At the same time, when electrical connection in the conductor innerlayer was tested, the conductor path was properly connected. The thickness of the circuit board was about 0.4 mm. An enlarged view of the exposed portions 7 and 8 is illustrated in FIG. 2. It was found that a proper electrical connection was achieved.

Figure 5A:
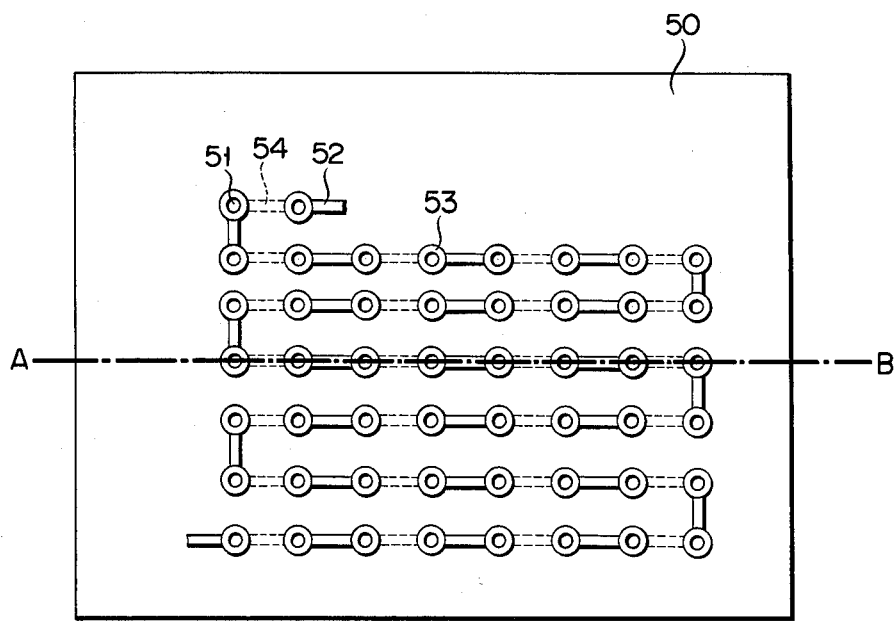
FIGS. 5A to 5C are respectively a plan view and sectional views showing a test circuit board so as to test the ON state of the conductor path of the circuit board prepared by the present invention.
Figure 5B:
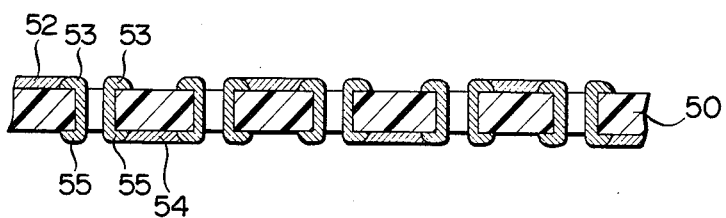
Figure 5C:
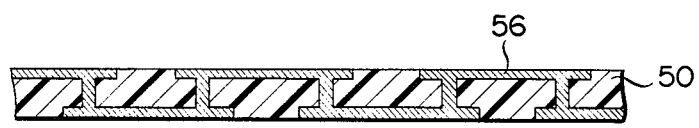

As shown in FIG. 5(A), 50 through holes 51 each having a diameter of 1 mm were formed at pitches of 10 mm in a vinyl chloride film 50 having a thickness of 0.3 mm. The conductive resin composition was printed on one major surface of the film and was dried to obtain conductors 52 and 53. Similarly, the conductor resin composition was printed on the other major surface of the film and was dried to prepare conductors 54 and 55. The conductors 53 and 55 flowed into the holes 51 at the time of printing, so that the cross section of the resultant structure along the alternate long and short dashed line A-B in FIG. 5(A) was as illustrated in FIG. 5(B). The vinyl chloride film 50 was pressed at a predetermined temperature and pressure. As shown in FIG. 5(C), the holes 51 were clogged such that the conductors 52, 53, 54 and 55 were mutually connected, thereby obtaining a conductor path 56. In this case, the conductors 52, 53, 54 and 55 had the same level as those of the upper and lower surfaces of the vinyl chloride film 50. The resistance from one end to the other end of the conductor path 56 was 15 $\Omega$. The conductor path was not disconnected. Even if the circuit board was bent, its resistance did not change substantially.

EXAMPLE 2

Figure 6:
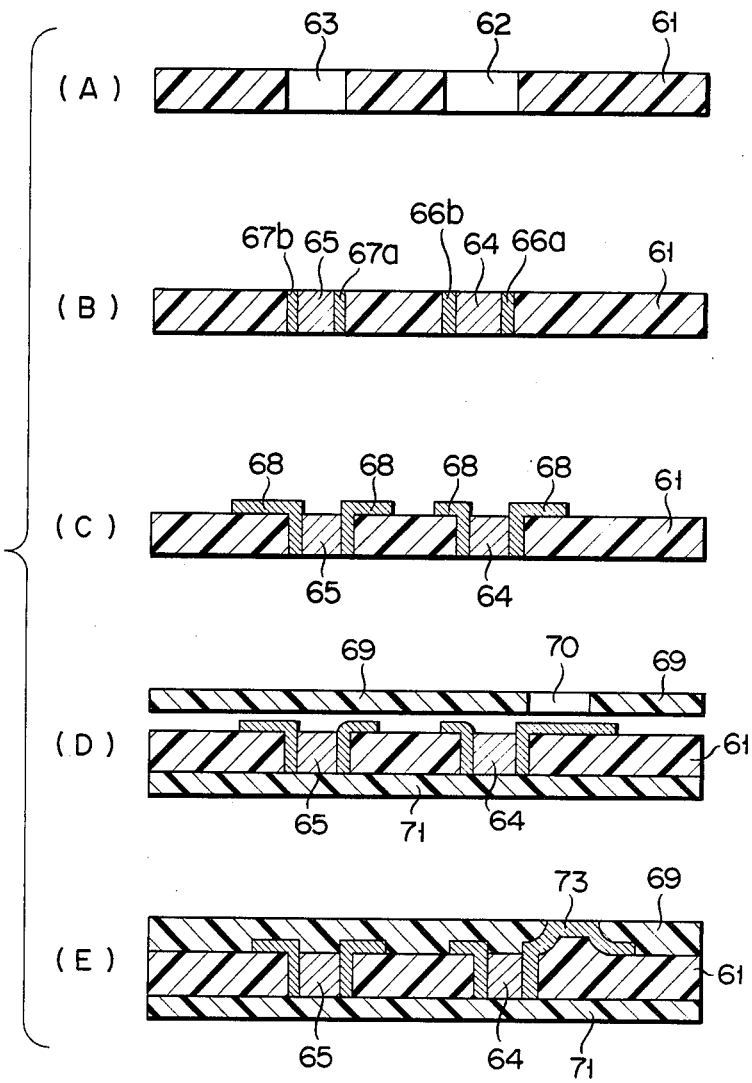
FIGS. 6A to 6E are respectively sectional views for explaining steps in manufacturing a circuit board according to still another embodiment of the present invention.

As shown in FIG. 6, in the same manner as in Example 1, through holes 62 and 63 having sizes of 2.5×1.4 mm and 3.0×1.8 mm, respectively, were formed in a hard vinyl chloride plate 61 having a thickness of 0.8 mm. A chip resistor 64 having dimensions of 2.5×1.4×0.8 mm and a chip capacitor 65 having dimensions of 3.0×1.8×0.8 mm were inserted in the holes 62 and 63, respectively. The upper and lower surfaces of these electrical components were smoothened to have the same level as those of the upper and lower surfaces of the vinyl chloride plate 61, respectively, as shown in FIG. 6(B). Reference numerals 66a, 66b, 67a and 67b denote terminals.

The same conductor resin composition as in Example 1 was printed and dried at a reduced pressure to prepare circuit patterns 68, as shown in FIG. 6(C). A through hole 70 was formed at a specific position of an insulating film 69 which was the same as in Example 1. The insulating film 69 was covered on the circuit pattern, as shown in FIG. 6(D). Another film 71 (having a thickness of 0.2 mm) of the same material as the film 69 was covered on the lower surface of the plate 61, thereby obtaining a circuit board as shown in FIG. 6(E) by thermocompression bonding. In this circuit board, part of the circuit pattern 68 was exposed and had the same level as that of the surface of the film 69 so as to constitute a surface 73. The electrical connections of the resultant circuit board were checked. No disconnections were detected.

EXAMPLE 3

Figure 7:
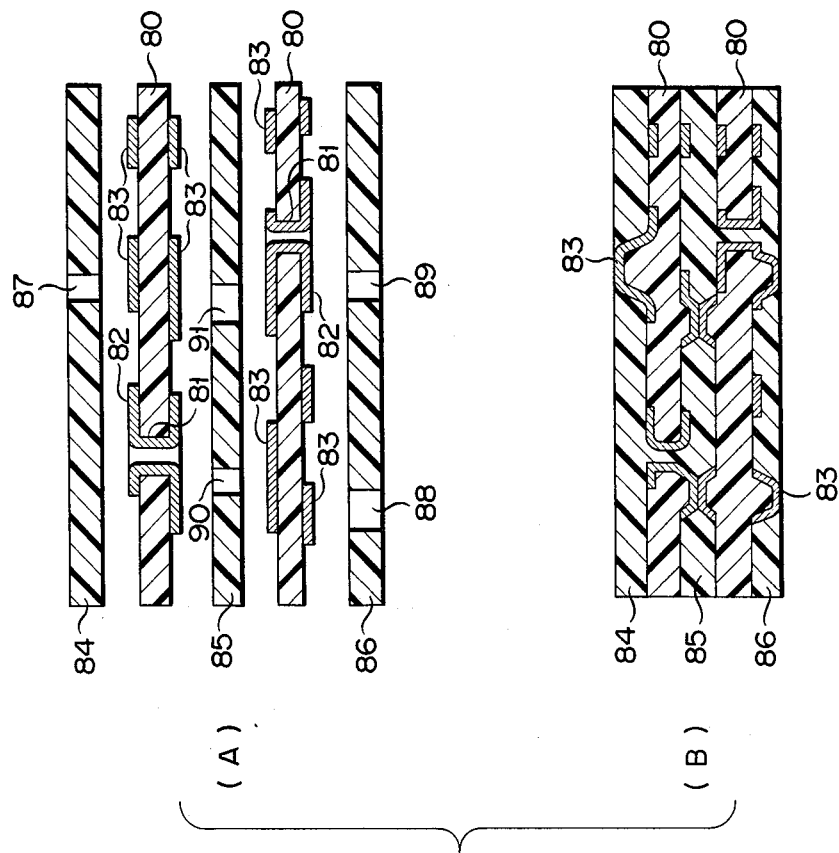
FIGS. 7A and 7B are respectively sectional views for explaining steps in manufacturing a circuit board according to still another embodiment of the present invention.

As shown in FIG. 7, two saturated polyester resin films 80 made of "Lumilar" (tradename) available from TORAY INDUSTRIES, INC., were prepared. Each resin film had a thickness of 1 mm. Through holes 81 each having a diameter of 1 mm were respectively formed in predetermined positions of the films 80. Conductor layers were respectively formed on the inner surfaces of the through holes 81. Circuit patterns 82 and 83 made of a conductive resin composition were printed on the upper and lower surfaces of each of the films 80 and were dried at a temperature of 100° C. for three hours.

The conductive resin composition was prepared such that the saturated polyester resin was dissolved in heated o-chlorophenol, and silver powder having an average particle size of 5μ was added. In this case, the composition consisted of 10 parts by weight of polyester resin, 50 parts by weight of o-chlorophenol and 90 parts by weight of silver powder. Printing was performed in accordance with a roll transfer method. In this case, the surfaces of the roll and the polyester plate were heated at a temperature of 60° to 80° C.

A saturated polyester insulating film 85 having through holes 90 and 91 and a thickness of 50 μm was sandwiched between the two substrates 80 having different conductor patterns. In addition, a saturated polyester film 84 having a through hole 87 and a thickness of 50 μm was placed on the upper substrate 80, and a saturated polyester film 86 which was the same as the film 84 and had through holes 88 and 89 was placed on the lower substrate 80. The resultant structure was bonded by thermocompression at a reduced pressure (resin pressure) of 50 to 60 kg/cm² at 210° C. for two hours. The resultant circuit board was removed from a mold after it was cooled. This circuit board has a section illustrated in FIG. 7(B). The conductors on the upper and lower circuit patterns were properly connected.

EXAMPLE 4

A butadiene-styrene copolymer resin available from MITSUBISHI MONSAN was used to prepare a sheet having a thickness of 0.6 mm in accordance with extrusion molding. This sheet is designated by reference numeral 40 in FIG. 4(A). Similarly, a transparent styrene resin sheet having a thickness of 0.1 mm was formed by extrusion molding. This sheet is designated by reference numeral 42 in FIG. 4(A). Furthermore, the butadiene-styrene copolymer resin was dissolved in a solvent mixture of cyclohexane and tetralin. Copper powder having an average particle size of 5μ and pyrogallol were added to the mixture. A resultant conductive material had the following composition:

Butadiene-styrene resin 10 parts by weight
Cyclohexane/tetralin 80 parts by weight
Copper powder 85 parts by weight
Pyrogallol 0.5 parts by weight As shown in FIG. 4(A), this conductive material was printed by screen printing on the sheet 40 to obtain a conductor pattern 41. The conductor pattern 41 was dried at a temperature of 40° to 50° C. under a reduced pressure. A transparent insulating film 42 was covered on the conductor pattern 41, and a resultant structure was laminated by a heat roll at a pressure (resin pressure) of 5 to 10 kg/cm² and a temperature of 150° C. The above operation was repeated twice.

A resultant laminate was molded by a mold in accordance with vacuum molding after the laminate was preheated to a temperature of 160° C. As a result, a three-dimensional circuit board was obtained, as shown in FIG. 4(B). It was found that respective conductor patterns were not disconnected, and that this circuit board could be properly used.

EXAMPLE 5

This example will be described in accordance with the process described with reference to FIGS. 1(A) to 1(D). A substrate 1 made of a B-stage epoxy resin was prepared. This epoxy resin was of bisphenol A type, had an average molecular weight of 2,500 and contained 5% of dicyandiamide. 100 parts by weight of a prepolymer consisting of the same B stage epoxy resin as described above were dissolved in 330 parts by weight of a solvent mixture of cyclohexane/n-butylcarbitol(1/1) under heating to prepare a uniform solution. 850 parts by weight of silver powder having an average particle size of 5 μm were added to the above solution. A resultant mixture was kneaded by a paint roll to obtain a conductive resin composition. This composition was printed by screen printing on the substrate 1 as shown in FIG. 1(B) and was dried at room temperature and a reduced pressure for one hour, thereby obtaining a circuit pattern 2. A hole 4 having a diameter of 3 mm was formed at a predetermined position in an insulating film 3 having a thickness of 0.1 mm and made of the same prepolymer as described above. The insulating film 3 was covered on the circuit pattern 2 printed on the substrate 1, and thermocompression bonding was performed, as shown in FIG. 1(C), at a temperature of 80° C. and a pressure (resin pressure) of 5 kg/cm² for 30 minutes. In order to convert the epoxy resin from the B stage to the C stage, the laminate was subjected to a crosslinking reaction under the same pressure, but at a temperature of 100° C. for 30 minutes, 120° C. for 20 minutes, and 150° C. for one hour. As a result, a circuit board was obtained wherein the surface of the insulating film 3 had the same level as that of the circuit pattern 2. Proper electrical connections between the exposed portion and buried portions of the circuit pattern were achieved. A circuit board was prepared in the same manner as in FIG. 5(A) to 5(C). In this case, a completely connected conductor path was formed, and the resistance from one end to the other end of the conductor path was 25 Ω. In addition, even if this circuit board was bent, the resistance did not change substantially.

EXAMPLE 6

As shown in FIG. 6(A), B-stage 1,2-polybutadiene resin containing 0.5% by weight of cumene peroxide and 50% by weight of fused silica having an average particle size of 10μ was pressed to obtain a substrate 61 having a thickness of 0.8 mm. Through holes 62 and 63 having dimensions of 2.4×1.2 mm and 3.0×1.8 mm were formed in the substrate 61. As shown in FIG. 6(B), a chip resistor 64 having dimensions of 2.4×1.2×0.8 mm and a chip capacitor 65 having dimensions of 3.0×1.8× 0.8 mm were inserted in the holes 62 and 63, respectively. The upper and lower surfaces of the chip resistor 64 and the chip capacitor 65 were smoothened to have the same level as those of the upper and lower surfaces of the substrate 61. It should be noted that reference numerals 66a, 66b, 67a and 67b denote terminals, respectively. 2% of cumene peroxide, 80% of silver powder having an average particle size of 5 μm, and a small amount of tetralin were added to the B-stage 1,2-polybutadiene resin to prepare a conductive resin composition by a three-roll mill. This conductive resin composition was printed, and was dried at a reduced pressure, thereby obtaining conductor patterns 68, as shown in FIG. 6(C).

As shown in FIG. 6(D), a through hole 70 was formed at a specific position in an insulating film 69 made of a prepolymer sheet. This prepolymer sheet was made of the same prepolymer as in the substrate 61. The insulating film 69 was covered on the circuit pattern 68, and an insulating film 71 (thickness of 0.1 mm) was covered on the lower surface of the substrate 61. A resultant structure was placed in a mold which could be heated and compressed and was pressed at a pressure (resin pressure) of 10 kg/cm² and at room temperature, thereby obtaining the circuit board having integral electrical parts. In this case, an exposed portion 73 of the circuit pattern 68 had the same level as that of the surface of the insulating film 69, as shown in FIG. 6(E). The upper and lower surfaces of the circuit board were pressed. The circuit board was heated to a temperature of 180° C. and was subjected to a crosslinking reaction. When electrical connections of the resultant substrate were checked, no disconnections were detected, and the circuit was properly operated.

EXAMPLE 7

As shown in FIG. 7(A), 20% by weight of glass fiber and 30% by weight of fused silica were added to the same resin polymer as in Example 6. Through holes 81 each having a diameter of 1 mm were formed at predetermined positions of substrates 80 made of this polymer, respectively. Circuit patterns 82 and 83 having conductor portions with a diameter of 2 mm and predetermined conductor patterns were printed in an aligned manner with respect to the holes 81. These circuit patterns 82 and 83 comprised the conductor resin composition. The conductor patterns were dried at room temperature for 24 hours. The conductor resin composition was the same as that in Example 6, and printing was performed in accordance with the roll transfer method.

An insulating film 85 which was made of the same material as the substrates 80 had holes 90 and 91 in specific positions and a thickness of 100 μm. An insulating film 84 having a thickness of 100 μm and a through hole 87 was covered on the upper surface of the upper substrate 80, and an insulating film 86 having a thickness of 100 μm and through holes 88 and 89 was covered on the lower surface of the lower substrate 80. The resultant structure was bonded by thermocompression at a temperature of 60° C. and a pressure (resin pressure) of 10 kg/cm², and then at a temperature of 180° C. and a pressure of 60 kg/cm² for 30 minutes. After the resultant laminate was cooled, it was removed from the mold. The resultant circuit board had the section shown in FIG. 7(B). Electrical connections between the upper and lower circuit patterns could be properly performed.

EXAMPLE 8

A sheet having a thickness of 0.5 mm and made of a B-stage polyethylene resin was used as a substrate. A conductor resin composition consisting of 10 parts by weight of B-stage polyethylene resin, 80 parts by weight of tetralin, 80 parts by weight of copper powder having an average particle size of 5 μm and 0.2 parts by weight of pyrogallol was prepared. In this case, the resultant mixture was kneaded by a heat roll heated at a temperature of about 60° C., thereby preparing a paste. This conductor resin composition was printed by screen printing on the substrate 40 to obtain a predetermined pattern 41 while the resin was kept heated at a temperature of 60° C. The circuit pattern 41 was dried at a temperature of 40° to 50° C. under a reduced pressure.

A polyethylene film 42 was covered on the conductor pattern, and the resultant structure was bonded by thermocompression at a temperature of 130° C. and a pressure (resin pressure) of 5 to 10 kg/cm² by using a heat roller. The above rolling was repeated twice.

The resultant circuit board sheet was placed in a female mold having a shape as indicated in FIG. 4(B). The sheet was preheated to a temperature of 160° C. and was subjected to vacuum molding. As a result, the three-dimensional circuit board shown in FIG. 4(B) was obtained. β-rays were irradiated onto the circuit board to cause the a crosslinking reaction thereof. It was found that the resultant circuit board was free from disconnections and could be properly used in practice.

We claim:

1. A method of manufacturing a circuit board, comprising the steps of:
    (a) laminating a plurality of resin substrates with at least one circuit pattern of a conductive resin composition interposed between said resin substrates to form a laminated composite, at least one of said resin substrates which constitutes an outermost layer of said laminated composite being provided with at least one through hole, said circuit pattern disposed adjacent said through hole and said resin substrates as well as said conductive resin composition having substantially the same softening point; and
    (b) thermally compressing thicknesswise said laminated composite at the softening point thereof to bond said resin substrates together and to plastically deform the circuit pattern thereby to allow a portion of said circuit pattern to be exposed through said through hole such that a surface of the exposed portion is flush with an exposed surface of the at least one of said resin substrates constituting said outermost layer.

2. A method according to claim 1, wherein said laminating step (a) comprises:
    disposing a circuit element between said resin substrates to connect said circuit element to said circuit pattern.

3. A method according to claim 1, wherein said step (a) comprises laminating three substrates including an intermediate substrate also having a through hole, and upper and lower substrates sandwiching the intermediate substrate and at least two of said circuit patterns respectively disposed between said intermediate substrate and said upper substrate, and between said intermediate substrate and said lower substrate; and in step (b) said circuit patterns disposed between said intermediate substrate and said upper substrate being plastically deformed to come in contact and to be bonded together through said through hole in said intermediate substrate.

4. A method according to claim 1, wherein a resin constituting the substrates and a resin constituting the resin composition comprise thermoplastic resins, respectively.

5. A method according to claim 1, wherein a resin constituting the substrates and a resin constituting the resin composition comprise thermosetting resins, respectively, the thermosetting resins being subjected to a crosslinking reaction and cured by heat, a catalyst or radiation.

6. A circuit board produced by the method recited in claim 1.

7. A circuit board produced by the method recited in claim 2.

8. A circuit board produced by the method recited in claim 3.

9. A circuit board produced by the method recited in claim 4.

10. A circuit board produced by the method recited in claim 5.

* * * * *